United States Patent Office 3,748,132

Patented July 24, 1973

3,748,132

PHOTOPOLYMERIZABLE COMPOSITIONS AND ELEMENTS AND USES THEREOF

Joseph A. Arcesi, Frederick J. Rauner, Robert C. McConkey, and John M. Noonan, Rochester, N.Y., assignors to Eastman Kodak Company, Rochester, N.Y.

No Drawing. Filed Mar. 24, 1972, Ser. No. 237,928

Int. Cl. G03c 1/68

U.S. Cl. 96—35.1 21 Claims

ABSTRACT OF THE DISCLOSURE

Novel photopolymerizable compositions comprise an ethylenically unsaturated sulfonate-carboxylate monomer, a film-forming aromatic polysulfonate or polysulfonate-carboxylate binder and a photoactivatable polymerization initiator. These compositions, and elements containing them, can be used to prepare resists, printing plates, and other photomechanical images.

This application relates to photosensitive compositions and elements and to methods of using such materials to prepare photomechanical images. In a particular aspect it relates to photopolymerizable compositions and elements and to their use in the preparation of photoresist images and printing plates.

Photopolymerizable compositions have been the subject of increasing interest in recent years. Such compounds typically comprise a monomer, containing unsaturated sites which are capable of undergoing addition polymerization, and a photoactivatable polymerization initiator. Preferably, these monomers have one or more terminal carbon to carbon double bonds, and have been referred to in the art as ethylenically unsaturated monomers. The photopolymerization initiator is a compound which produces free radicals on exposure to actinic radiation and which in its excited state will react with the double bond on the monomer to initiate polymerization. Optionally, these compositions also contain a binder to provide a solid layer when the composition is coated, a sensitizer which increases the photographic speed of the composition or extends its range of spectral response, or both, and a thermal polymerization inhibitor which prolongs the shelf life of the composition, as well as other addenda such as dyes, pigments and the like.

Such compositions have generally been employed in the photographic arts to prepare photomechanical images for use as etching or plating resists, relief and planographic printing plates, and the like. These reproduction processes make use of the difference in solubility and softening point which occurs upon exposure of the composition to actinic radiation and resultant polymerization of the monomer. Thus, in a typical process a layer of the photopolymerizable composition is exposed to actinic radiation to effect polymerization of the monomer in exposed areas and an image is developed by solvent washout of unexposed areas, thermal transfer of unexposed areas, or similar procedures. Representative photopolymerizable compositions and processes for employing them to prepare photomechanical images are described in such patents as U.S. Pats. 2,760,863, 3,060,023, 3,346,383, 3,353,955, 3,458,311, 3,469,982.

We have found novel photopolymerizable compositions containing novel photopolymerizable monomers and binders which give hard, non-brittle, photomechanical images. These compositions can be used to prepare photoresists and printing plates by solvent development or thermal transfer processes, as well as to prepare other types of photographic images for which photopolymerizable compositions have typically been used.

It is a further object to provide novel photopolymerizable compositions comprising a photopolymerizable monomer and a polymeric binder.

It is still another object of this invention to provide novel photosensitive elements employing the photopolymerizable monomers and compositions of the present invention.

It is yet a further object of this invention to provide novel photoresist compositions and lithographic printing plates employing the photopolymerizable monomers and compositions of this invention.

It is another object of this invention to provide processes for preparing photomechanical images employing the photopolymerizable monomers and compositions of the present invention.

The above and other objects of this invention will become apparent to those skilled in the art from the further description of the invention which follows.

In accordance with the present invention there is provided a photopolymerizable composition comprising an ethylenically unsaturated sulfonate-carboxylate monomer, a film-forming aromatic polysulfonate or polysulfonate-carboxylate binder, a photoactivatable polymerization initiator, and optionally, such components as thermal polymerization inhibitors, sensitizers and the like.

Photopolymerizable sulfonate-carboxylate monomers which are suitable for use in the compositions of this invention include those which can be represented by the formula:

(I)

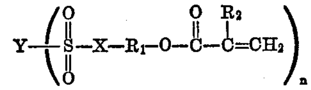

where Y is a di-, tri-, or tetravalent aromatic group such as o-phenylene, m-phenylene, m-xylene-2,6-diyl, biphenylylene, 1,5-naphthalenediyl, 2,7-naphthalenediyl, 3-(4 - anilino - 1 - naphthylazo)naphthalene-2,7-diyl, 1,5-anthraquinonediyl, 2,6-anthraquinonediyl, s-phenyl, 1,3,6-naphthalenetriyl, 2 - (1′ - naphthylazo) - naphthalene-3,6,3′,6′-tetrayl and the like; or a di- or trivalent aliphatic group such as methylene, ethylene, tetramethylene, 1,3,5-pentanetriyl nitrilotris(ethylene), and the like; $R_1$ is an alkylene group, an arylene group, or a mixed alkylene-arylene group such as ethylene, propylene, trimethylene, tetramethylene, pentamethylene, phenylene, isopropylidenebis(phenylene), phenylenedimethylene, phenylenbis-(oxyethylene), phenylenebis[oxo(3 - oxa - 1,5-pentylene)], and the like; $R_2$ is hydrogen or a methyl group; X is oxygen or an imino group including substituted imino groups such as methylimino, ethylimino, phenylimino, and the like; and $n$ is an integer of 2 to 4.

Preferred photopolymerizable sulfonate - carboxylate monomers which are useful in the compositions of the present invention can be represented by the structure:

(II)

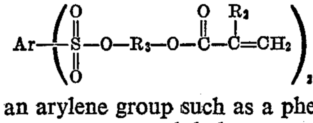

where Ar is an arylene group such as a phenylene group, a biphenylylene group, a naphthylene group, an anthrylene group, etc., including arylene groups substituted with substituents which will not interfere with the condensation reaction such as halogen, nitro, cyano, lower alkyl of 1 to 12 carbon atoms, e.g., methyl, ethyl, propyl, isopropyl, butyl, sec-butyl, t-butyl, n-amyl, isoamyl, hexyl, heptyl, octyl, nonyl, decyl, undecyl, dodecyl, etc., lower alkoxy of 1 to 12 carbon atoms, e.g., methoxy, ethoxy, propoxy, butoxy, amyloxy, hexoxy, heptoxy, etc., and the like; preferably Ar is a phenylene group; $R_3$ is an alkylene group of 2 to 4 carbon atoms, e.g., ethylene, propylene, butylene; and $R_2$ is as defined above.

Representative monomers having the above formulae include 1,2-bis(acryloyloxyethylsulfamoyl)benzene
Dimethacryloyloxybutyl 1,3-benzenedisulfonate
Dimethacryloyloxyethyl m-xylene-2,6-disulfonate
Diacryloyloxypropyl 3-(4-anilino-1-naphthylazo)-naphthalene-2,7-disulfonate
Dimethacryloyloxyethyl 4,4′-biphenyldisulfonate
1,5-bis(N-methyl-N-methacryloyloxyethylsulfamoyl)-naphthalene
p-(Dimethacryloyloxy)phenyl 2,7-naphthalenedisulfonate
Bis(p-methacryloyloxymethylbenzyl) 1,5-anthraquinonedisulfonate
Bis[p-(2-methacryloyloxy)ethoxyphenoxyethyl] 2,6-anthraquinonedisulfonate
Tris{p-[2-(p-methacryloyloxyphenyl)isopropyl]phenyl}-1,3,5-benzenetrisulfonate
Trimethacryloyloxyethyl 1,3,6-naphthalenetrisulfonate
Tetramethacryloyloxyethyl 2-(1′-naphthylazo)naphthalene-3,6,3′,6′-tetrasulfonate
Diacryloyloxyethyl methanedisulfonate
Dimethacryloyloxyethyl 1,2-ethanedisulfonate
Dimethacryloyloxyethyl 1,4-butanedisulfonate
Triacryloyloxyethyl 1,3,5-pentanetrisulfonate
Tris(methacryloyloxysulfonylethyl)amine
Dimethacryloyloxyethyl 1,3-benzenedisulfonate
1,3-bis(N-methacryloyloxyethyl-N-phenylsulfamoyl)benzene
Diacryloyloxyethyl m-xylene-2,6-disulfonate.

These compounds can be prepared by reacting a di-, tri-, or tetrasulfonyl chloride, preferably an aromatic disulfonyl chloride such as a benzenedisulfonyl chloride, with an ester of an alkyl acrylate or alkyl methacrylate having an active hydrogen (e.g. hydroxy, amino, etc.), preferably with a hydroxyalkyl acrylate or hydroxyalkyl methacrylate.

The preparation of the monomers of this invention can be illustrated by the following reaction

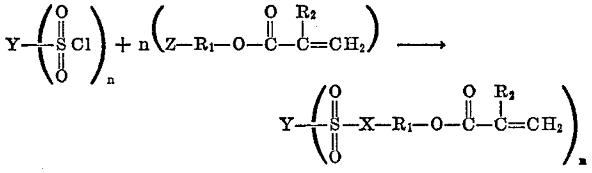

where Y, $R_1$, $R_2$, X and $n$ are as defined above, and Z is a group containing an active hydrogen, e.g., a hydroxy group or an amino group.

While these monomers give useful results in photopolymerizable compositions which do not contain a binder, or in compositions which contain one or more of a variety of film-forming polymeric binders, such as those known in the art for use in photopolymerizable compositions, as well as others, they give particularly useful results in compositions containing the aromatic polysulfonate or polysulfonate-carboxylate binders described below.

The film-forming binders which are particularly useful in the compositions of the present invention are non-light-sensitive aromatic polysulfonates or polysulfonate-carboxylates, prepared by condensing at least one bisphenol, in at least one of which the phenol groups are joined to each other by an aliphatic ketone group or an aliphatic secondary alcohol group (including cycloaliphatic ketone and secondary alcohol groups), with at least one aromatic disulfonic acid chloride (in the case of polysulfonates) or with a mixture of at least one aromatic disulfonic acid chloride and at least one aromatic dicarboxylic acid chloride or aromatic bischloroformate (in the case of polysulfonate-carboxylates). After preparation, the polymers from a bisphenol containing an aliphatic secondary alcohol group can be modified by reaction with an alkyl acid halide to convert at least some of the secondary alcohol groups to alkyl ester groups.

Thus, these polymers contain units derived from at least one bisphenol, in at least one of which the phenol groups are joined by an aliphatic ketone group or an aliphatic secondary alcohol group alternating with units derived from an aromatic diacid chloride. In the case of polysulfonate binders the alternating units are derived solely from aromatic disulfonic acid chlorides. In the case of polysulfonate-carboxylate binders, the alternating units are derived from aromatic disulfonic acid chlorides and aromatic dicarboxylic acid chlorides or aromatic bischloroformates.

Units derived from a bisphenol containing an aliphatic ketone group or an aliphatic secondary alcohol group joining the phenol groups can be represented by the structure (III)

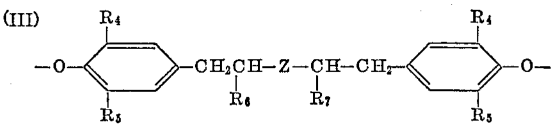

where $R_4$ and $R_5$ are each hydrogen, lower alkyl of 1 to 4 carbon atoms, e.g. methyl, ethyl, propyl, butyl etc. or lower alkoxy of 1 to 4 carbon atoms e.g. methoxy, ethoxy, propoxy, butoxy, etc.; $R_6$ and $R_7$ are each hydrogen or together represent the hydrocarbon group necessary to complete a saturated ring of 5 to 6 carbon atoms e.g. cyclopentylene and cyclohexylene; Z is a

group or a

group; and $R_8$ is hydrogen or an alkanoyl group of 2 to 20 carbon atoms e.g. ethanoyl, butanoyl, pentanoyl, hexanoyl, decanoyl, dodecanoyl, hexadecanoyl, eicosanoyl, etc.

Representative bisphenols from which this structure can be derived include:

1,5-bis(4-hydroxyphenyl)pentan-3-one,
1,5-bis(4-hydroxyphenyl)pentan-3-ol,
2,5-bis(4-hydroxybenzyl)cyclopentanone,
2,5-bis(4-hydroxybenzyl)cyclopentanol,
2,6-bis(4-hydroxybenzyl)cyclohexanone,
2,6-bis(4-hydroxybenzyl)cyclohexanol,
1,5-bis(4-hydroxy-3-methoxyphenyl)pentan-3-one,
1,5-bis(4-hydroxy-3-methoxyphenyl)pentan-3-ol,
2,5-bis(4-hydroxy-3-methoxybenzyl)cyclopentanone,
2,5-bis(4-hydroxy-3-methoxybenzyl)cyclopentanol,
2,6,bis(4-hydroxy-3-methoxybenzyl)cyclohexanone,
2,6-bis(4-hydroxy-3-methoxybenzyl)cyclohexanol,
1,5-bis(4-hydroxy-3-ethoxyphenyl)pentan-3-one,
1,5-bis(4-hydroxy-3-butoxyphenyl)pentan-3-ol,
2,5-bis(4-hydroxy-3-methylbenzyl)cyclopentanone,
2,5-bis(4-hydroxy-3-ethylbenzyl)cyclopentanol,
2,6-bis(4-hydroxy-3-propylbenzyl)cyclohexanone,
2,6-bis(4-hydroxy-3-butylbenzyl)cyclohexanol,
1,5-bis(4-hydroxy-3,5-dimethoxyphenyl)pentan-3-ol,
1,5-bis(4-hydroxy-3,5-dimethylphenyl)pentan-3-one,
2,5-bis(4-hydroxy-3,5-dimethylbenzyl)cyclopentanone,
2,5-bis(4-hydroxy-3,5-dimethoxybenzyl)cyclopentanol.

Units derived from other bisphenols, which can be contained in the polymeric binder in addition to the units having the Structure III, above, can be represented by the structure:

(IV)

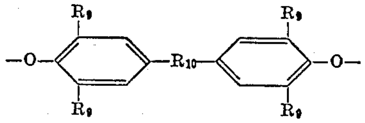

wherein $R_9$ is independently hydrogen, halogen or lower alkyl of 1 to 4 carbon atoms and $R_{10}$ is an alkylene group of 1 to 8 carbon atoms.

Representative bisphenols which provide units of this structure include 2,2-bis(4-hydroxyphenyl)propane [Bisphenol A],
2,2-bis(4-hydroxy-3,5-dichlorophenyl)propane [Tetrachloro Bisphenol A],
2,2-bis(4-hydroxy-3,5-dibromophenyl)propane [Tetrabromo Bisphenol A],
2,2-bis(4-hydroxy-3,5-diiodophenyl)propane [Tetraiodo Bisphenol A],
bis(4-hydroxyphenyl)methane, and
2,2'-bis(4-hydroxyphenyl)hexane.

Suitable units derived from aromatic disulfonic acid chlorides can be represented by the structure:

(V)
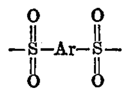

wherein Ar represents an arylene group, as defined above in Structure II.

Preferred units derived from aromatic disulfonic acid chlorides are represented by the structure:

(VI)
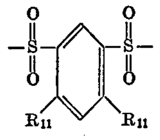

wherein $R_{11}$ is independently a hydrogen atom or a lower alkyl group of 1 to 4 carbon atoms, e.g., methyl, ethyl, propyl, butyl.

Representative aromatic disulfonic acid chlorides from which units of the above structural formulae can be derived include benzenedisulfonyl chlorides such as:

1,3-benzenedisulfonyl chloride,
1-chloro-2,4-benzenedisulfonyl chloride,
1-bromo-3,5-benzenedisulfonyl chloride,
1-nitro-3,5-benzenedisulfonyl chloride,
1-cyano-3,5-benzenedisulfonyl chloride,
1-methyl-2,4-benzenedisulfonyl chloride,
1-methyl-4-chloro-2,6-benzenedisulfonyl chloride,
1-ethyl-2,4-benzenedisulfonyl chloride,
1-butyl-2,4-benzenedisulfonyl chloride,
1,2-dimethyl-3,5-benzenedisulfonyl chloride,
1,3-dimethyl-2,4-benzenedisulfonyl chloride,
1,3-dimethyl-4,6-benzenedisulfonyl chloride,
1,4-dimethyl-2,6-benzenedisulfonyl chloride,
1-methoxy-2,4-benzenedisulfonyl chloride;

biphenyldisulfonyl chlorides such as 2,2'-biphenyldisulfonyl chloride,
3,3'-biphenyl-disulfonyl chloride,
4,4'-biphenyldisulfonyl chloride,
4,4'-dibromo-3,3'-biphenyldisulfonyl chloride,
4,4'-dimethyl-3,3'-diphenyldisulfonyl chloride;

naphthalene- and anthracenedisulfonyl chlorides such as 1,3-naphthalenedisulfonyl chloride,
2,6-naphthalenedisulfonyl chloride,
1-chloro-2,7-naphthalenedisulfonyl chloride,
1-chloro-3,5-naphthalenedisulfonyl chloride,
1-nitro-3,6-naphthalenedisulfonyl chloride,
2-ethoxy-1,6-naphthalenedisulfonyl chloride,
1,5-anthracenedisulfonyl chloride,
1,8-anthracenedisulfonyl chloride, etc; and the like.

Suitable units derived from aromatic diacid chlorides can be represented by the structure:

(VII)
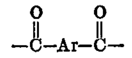

wherein Ar is as defined above in Formula II and preferably by the structure (VIII)
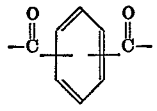

Representative aromatic diacid chlorides which can provide such units include phthaloyl chloride,
terephthaloyl chloride,
isophthaloyl chloride,
2,5-naphthalene dicarboxylic acid chloride,
4,4'-biphenyldicarboxylic acid chloride, etc.

Suitable units derived from bischloroformates can be represented by the structural formula:

(IX)
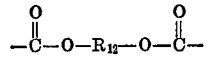

wherein $R_{12}$ is an alkylene group of 1 to 20 carbon atoms such as ethylene, propylene, diethylene, pentylene, neopentylene, nonylene, decylene, etc.

Bischloroformates which can provide units having this structure include ethylene bischloroformate,
diethylene bischloroformate,
triethylene bischloroformate,
1,3-propanediol bischloroformate,
2-methyl-2-nitro-1,3-propanediol bischloroformate,
2-ethyl-2-isobutyl-1,3-propanediol bischloroformate,
diisopropylene bischloroformate,
pentamethylene bischloroformate,
neopentyl bischloroformate,
nonamethylene bischloroformate,
decamethylene bischloroformate,
tetradecamethylene bischloroformate,
octadecamethylene bischloroformate,
2,2,4,4-tetramethyl-1,3-cyclobutylene bischloroformate,
2,4-dimethyl-2,4-dipropyl-1,3-cyclobutylene bischloroformate
cis-cyclododecylene-1,2-bischloroformate,
5-cis-9-transcyclododecylene-1,2-cis-bischloroformate,
dispiro[5.1.5.1]tetradecylene-7,12-bischloroformate,
1,4-cyclohexanedimethanol bischloroformate,
1,3-cyclohexanedimethanol bischloroformate,
1,4-bis($\beta$-hydroxyethoxy)cyclohexane bischloroformate,
ditetramethylsuccinate bischloroformate,
dinonamethyleneazelate bischloroformate,
bis[2-(2-chloroformyloxyethylsulfonyl)ethyl]ether, and
1,2-bis[2-(chloroformyloxyethylsulfonyl)ethoxy]ethane.

These polymeric binders can be prepared by conventional polymerization techniques such as solution polymerization, interfacial polymerization, and similar techniques. Typically, the bisphenol, or its alkali metal salt, is reacted with the acid chloride in an inert organic solvent in the presence of a catalyst such as a basic organic catalyst such as quaternary ammonium salts, amines, and the like. The reaction mixture is maintained at room temperature or slightly elevated temperatures and stirred for varying periods of time. The resultant polymer can be collected by precipitation with a non-solvent therefor and then washed and dried. Suitable preparative techniques for preparing these polymeric binders are described in such patents as U.S. Pats. 3,262,914, 3,236,808, 3,236,809 and 3,401,148.

While these polymeric binders are particularly suitable for use in photopolymerizable compositions containing the monomers described above, they can be used in conjunction with other monomers.

The photoactivatable polymerization initiators useful in the compositions of the present invention can be any of the photopolymerization initiators known and employed in the art. Preferably, these compounds are thermally inactive at temperatures encountered during storage and handling of the compositions and elements prepared therewith, i.e., temperatures below about 100° C.

Suitable initiators include aryldiazo sulfones such as those described in Rauner et al. U.S. Appln, Ser. No. 46,517 filed June 15, 1970 which also describes suitable sensitizers. Other suitable initiators include polynuclear quinones, which are compounds having two intracyclic carbonyl groups attached to intracyclic carbon atoms in a conjugated carbocyclic ring system, e.g., 9,10-anthraquinone, 1,4-naphthoquinone, 9,10-phenanthraquinone, 1,2-benzanthraquinone, etc., aromatic ketones, including vicinal ketaldonyl compounds, such as benzoin, pivaloin, etc., α-ketaldonyl alcohols, such as benzoin, pivaloin, etc., acyloin ethers e.g. 2-methoxy-2-phenylacetophenone, 2-ethoxy-2-phenyl-acetophenone etc. α-hydrocarbon substituted aromatic acyloins, including α-methyl benzoin, α-allylbenzoin and α-phenylbenzoin, polynuclear quinones such as 2-t-butylanthraquinone, and the like initiators. Such initiators are described in such patents as U.S. Pats. 2,367,660, 2,367,661, 2,367,670, 2,448,828, 2,722,512 and 3,046,127. Synergistic mixtures of initiators which are useful in the present invention include those described in U.S. Pat. 3,427,161 such as the mixture of benzophenone and Michler's ketone.

The compositions of the present invention can also incorporate thermal polymerization inhibitors to prevent premature polymerization of the composition during storage and handling. Suitable such inhibitors include p-methoxyphenol, hydroquinone, and alkyl and aryl-substituted hydroquinones and quinones, tert-butylcatechol, pyrogallol, copper resinate, naphthylamines, beta-naphthol, cuprous chloride, 2,6-di-tert-butyl p-cresol, phenothiazine, pyridine, nitrobenzene and dinitrobenzene, in addition to p-toluquinone and chloranil.

The coating compositions also can include a variety of photographic addenda utilized for their known purpose, such as agents to modify the flexibility of the coating, agents to modify its surface characteristics, dyes and pigments to impart color to the coating, agents to modify the adhesivity of the coating to the support, antioxidants, preservatives, and a variety of other addenda known to those skilled in the art.

Coating compositions of this invention, can be prepared by dispersing or dissolving the constituents in any suitable solvent or combination of solvents used in the art to prepare coating dopes. Solvents that can be used to advantage are volatile organic solvents and include ketones such as 2-butanone, acetone, 4-methyl - 2 - pentanone, cyclohexanone, 2,4-pentanedione, 2,5-hexanedione etc.; esters such as 4-butyrolactone, 2-ethoxyethyl acetate, 2-methoxyethyl acetate, n-butyl acetate, 2-methoxyethyl acetate, etc.; ethers such as 2-ethoxy ethanol; chlorinated hydrocarbon solvents such as chloroform, dichloroethane, trichloroethane, tetrachloroethane, etc.; and mixtures of these solvents.

Typically, the photopolymerizable compound and the film-forming binder can each be employed in the coating composition in the range from about 1 to 40 percent by weight. Preferably, they each comprise 5 to 25 percent by weight of the composition in a solvent such as listed above. The initiator can be incorporated in the coating composition in the range of about 0.1 to 25 percent by weight. The preferred range of initiator concentration is 0.1 to 10 percent by weight of the composition.

Photosensitive elements can be prepared by coating the photosensitive compositions from solvents onto supports in accordance with usual practices. Suitable support materials include fiber-base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold platinum, etc.; synthetic polymeric materials such as polyethylene, polypropylene, poly(alkyl methacrylate), e.g., poly(methyl methacrylate), polyester film base, e.g., poly(ethylene terephthalate), poly(vinyl acetals); polyamides, e.g., nylon, cellulose ester film base, e.g., cellulose nitrate, cellulose acetate, cellulose acetate propionate, cellulose acetate butyrate and the like. The optimum coating thickness for a particular purpose will depend on such factors as the use to which the coating will be put, the particular light-sensitive composition employed, and the nature of other compounds which may be present in the coating. Typical coating thicknesses can be from about 0.1 to 15 mil.

The coating composition can be coated directly on the support on which it is to be used in the preparation of a resist, a printing plate, or the like, or it can be coated on a temporary support and transferred, e.g., by thermal lamination, to the support where it is to be used, either uniformly or in an imagewise fashion. Such transfer techniques are described, for example, in U.S. Pats. 3,060,023, 3,346,383, 3,469,982 and in U.S. application Ser. Nos. 46,525 and 46,526 filed June 15, 1970.

Photomechanical images can be prepared with photosensitive elements of this invention by imagewise exposing the element to a source of actinic radiation for a period of time sufficient to polymerize and insolubilize material in exposed areas. Exposures of from several seconds to several minutes, or longer, e.g., ten seconds to fifteen minutes, are generally adequate. Suitable light sources that can be employed in exposing the elements include sources rich in visible radiation and sources rich in ultraviolet radiation, such as carbon arc lamps, xenon lamps, mercury vapor lamps, fluorescent lamps, tungsten lamps, lasers and the like.

An image can then be developed by solvent washout of the unexposed non-insolubilized areas, using one of the solvents listed above as coating solvents, or others, by thermal transfer of the unexposed, non-hardened areas, or by other techniques known to those skilled in the art.

The following examples further illustrate the invention.

EXAMPLE 1

The preparation of bis(2-methacryloyloxyethyl) m-xylene-4,6-disulfonate

In a 500 ml. round bottom flask fitted with a thermometer and air stirrer is placed 26.0 g. (0.2 mole) of 2-hydroxyethyl methacrylate in 15 ml. of dichloroethane and 15.8 g. (0.2 mole) of pyridine. The stirred solution is cooled to 0° C. and maintained at this temperature during the addition (10 minutes) of 30.3 g. (0.1 mole) of 1,3-dimethyl-4,6-benzenedisulfonyl chloride. When the addition is completed, the solution is held at 0° C. for 30 minutes. At this time an additional 20 ml. of 1,2-dichloroethane is added and the reaction mixture stirred for 2.5 hours at 0–10° C. The reaction mixture is then treated with an excess of dilute hydrochloric acid to remove excess pyridine and the aqueous solution is extracted with 1,2-dichloroethane. The dichloroethane solution is washed twice with water and the volume reduced by evaporation of the solvent. The title compound is isolated in 82 percent (40 g.) yield, M.P. 92–95°. The NMR spectrum is consistent with the structure of the title compound.

*Analysis.*—Calcd. for $C_{20}H_{26}O_{10}S_2$ (percent): C, 48.9; H, 5.3; S, 13.0. Found (percent): C, 48.0; H, 5.3; S, 13.4.

EXAMPLES 2–5

Using the procedure of Example 1, the following compounds are prepared, where $R_{13}$ is $$-O-CH_2CH_2-O-\overset{O}{\overset{\|}{C}}-\overset{CH_3}{\overset{|}{C}}=CH_2$$

| Example | Structure | Percent sulfur calc'd/found |
|---|---|---|
| 2 | 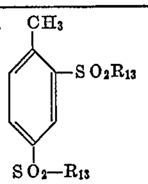 | 13.5/14.1 |
| 3 | 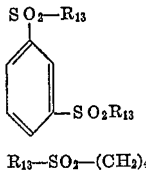 | 13.9/14.2 |
| 4 | $R_{13}-SO_2-(CH_2)_4-SO_2-R_{13}$ | 14.5/14.2 |
| 5 | 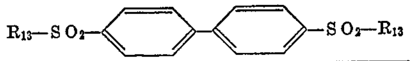 | 11.9/12.2 |

EXAMPLE 6

Preparation of a polysulfonate copolymer

In a 500 ml. round bottom flask equipped with a stirrer, condenser, and addition funnel are placed 13.20 g. (0.04 mole) of 1,5-bis(4-hydroxy-3-methoxyphenyl)pentan-3-one, and 84 ml. (0.084 mole) of normal sodium hydroxide. The solution is stirred for 10 minutes and 0.24 g. of benzyltriethylammonium chloride is added. The solution is stirred an additional five minutes. To this stirred solution is added rapidly (1 minute) 5.50 g. (0.02 mole) of 1,3-benzenesdisulfonyl chloride and 6.06 g. (0.02 mole) 1,3-dimethyl-4,6-benzenesdisulfonyl chloride dissolved in 84 ml. of methylene chloride. After the addition is completed, the solution is stirred for 2 hours. The resultant polymer is isolated by dripping the reaction mixture into hot water with stirring. The polymer is placed in a blender with methanol and chopped up into small particles, then leached with a methanol-water mixture for 3 hours, then filtered and dried in a vacuum oven at 50° C. for 20 hours. The white polymer copoly[cyclopentanon-2,5 - ylenedimethylenebis(3 - methoxy - p-phenylene)-1,3-benzenedisulfonate - co - 1,3 - dimethyl-4,6-benzenedisulfonate] is isolated in better than 90 percent yield. Inherent viscosity is 1:1 by volume mixture of pheneol-chlorobenzene (0.25 g./100 cc. solution at 25° C.) is 1.7. Unless otherwise specified, inherent viscosities reported in subsequent examples are measured using the same solvents and conditions as this example.

EXAMPLE 7

Preparation of a poly(sulfonate-carboxylate)

In a 300 ml. round bottom flask equipped with a stirrer, condenser, thermometer and dropping funnel are placed 14.2 g. (0.04 mole) of 2,5-bis(4-hydroxy-3-methoxybenzyl)cyclopentanone and 100 ml. of methylene chloride. The contents of the flask are heated until solution is completed and then cooled to 25° C. To this stirred solution is added 5.78 g. (0.02 mole) of 1-methyl-2,4-benzenedisulfonyl chloride and 4.06 g. (0.02 mole) of terephthaloyl chloride dissolved in 40 ml. of methylene chloride. To the above solution is added dropwise over a 5-minute period 8.90 g. (0.088 mole) of triethylamine. The temperature rises to 40° C. and heat is applied to maintain reflux for 45 minutes. The resultant polymer is isolated by driping the reaction mixture into hot water. The solution is filtered and the polymer placed in a blender with methanol and chopped into small particles, then leached with a methanol-water mixture for 3 hours and dried in a vacuum oven at 50° C. for 20 hours. The white polymer copoly[cyclopentanone-2,5-ylenedimethylenebis-(3-methoxy-p-phenylene) 1-methyl - 2,4 - benzenedisulfonate-co-terephthalate] is isolated in better than 90% yield. Inherent viscosity is 0.82.

*Analysis.*—Calcd. for $C_{57}H_{55}O_{16}S_2$ (percent): C, 64.6; H, 5.2; S, 6.1. Found (percent): C, 64.2; H, 5.6; S, 5.8.

EXAMPLE 8

Preparation of a polysulfonate-carboxylate copolymer

In a 300 ml. round bottom flask equipped with a stirrer, condenser, thermometer and dropping funnel is mixed 13.30 g. (0.04 mole) of 1,5-bis(4-hydroxy-3-methoxyphenyl)pentan-3-ol (HHDVA) and 40 ml. of methylene chloride. To the well-stirred mixture is added a methylene chloride solution of 5.78 g. (0.02 mole) of 2,4-toluenedisulfonyl chloride (m-TDSC), 2.03 g. (0.01 mole) isophthaloyl chloride (IPC), and 203 g. (0.01 mole) of terephthaloyl chloride (TPC). The temperature of the reaction solution rises from 23° C. to 35° C. as 8.90 g. (0.088 mole) of triethylamine is added dropwise to the mixture. Solution is effected. An additional 20 ml. of methylene chloride is used to rinse the reagent addition equipment. The reaction is run a total of 35 minutes. The reaction solution is poured into hot water and the precipitated polymer, copoly[3-hydroxy-1,5-pentylenebis-(3-methoxy-p-phenylene) 1,3-dimethyl-2,4-benzene disulfonate-co-isophthalate-co-terephthalate], is dried under vacuum at 50° C. for 24 hours. Yield is 20.0 g. Inherent viscosity is 0.64.

*Analysis.*—Calcd. (percent): C, 62.69; H, 5.48; S, 6.34. Found (percent): C, 62.6; H, 5.8; S, 6.3.

Using the same reactants, polymers are prepared having inherent viscosities ranging from 0.34 to 1.11.

EXAMPLE 9

Preparation of a polysulfonate-carboxylate copolymer

In a 3-liter round bottom flask is placed 127.8 g. (0.768 mole) of HHDVA and 58.0 g. (0.2 mole) of m-TDSC. To the mixture is added 1000 ml. of methylene chloride and vigorous stirring of the mixture is continued for 5 minutes. To the stirred mixture is added 97.2 g. (0.96 mole) of triethylamine via dropping funnel over a period of 30 minutes. To the solution is added 3.01 g. (0.032 mole) of phenol. Isophthaloyl chloride, 20.3 g. (0.1 mole) and terephthaloyl chloride 20.3 g. (0.1 mole) are dissolved in 300 ml. of methylene chloride and slowly added to the reaction flask at such a rate as to maintain a reaction temperature of 30° C. All the reagent additions are followed by a methylene chloride wash to insure complete transfer. The reaction is allowed to stir for 1½ hours after all the additions are complete. The solution is quenched with 300 ml. of a 2% hydrochloric acid solution. The organic layer is washed with water until the washings are neutral. The polymer, copoly[3-hydroxy-1,5-pentylenebis(3 - methoxy - p - phenylene) 1,3-dimethyl-2,4 - benzenedisulfonate - co - isophthalate-co-terephthalate], is precipitated in methanol. Yield is 192.7 g. Inherent viscosity is 0.37.

*Analysis.*—Calcd. (percent): C, 62.9; H, 5.5; S, 6.3. Found (percent): C, 62.5; H, 5.3; S, 6.9.

EXAMPLE 10

Preparation of a polysulfonate-carboxylate copolymer

In a 300 ml. flask is mixed 6.65 g. (0.02 mole) of HHDVA and 6.70 g. (0.02 mole) of 1,5-bis(4-hydroxy-3-methoxyphenyl)pentan-3-one (HDVA). A 60 ml. methylene chloride solution containing 5.80 g. (0.02 mole) of 2,4-toluenedisulfonyl chloride, 2.03 g. (0.01 mole) of isophthaloyl chloride and 2.03 g. (0.01 mole) of terephthaloyl chloride is added to the mixture of phenols. Triethylamine, 8.90 g. (0.088 mole), is added dropwise over a 10-minute period with vigorous stirring. The reaction solution is stirred for 15 minutes before precipitating the polymer, copoly[3-hydroxy - 1,5 - pentylenebis(3-methoxy-p-phenylene)-co-3-pentanon - 1,5 - ylenebis(3-methoxy-p-phenylene) 1,3 - dimethyl-2,4-benzenedisulfonate-co-isophthalate-co-terephthalate], in hot water. Yield is 21.0 g. Inherent viscosity is 0.78.

*Analysis.*—Calcd. (percent): C, 63.0; H, 5.3; S, 6.4. Found (percent): C, 62.4; H, 5.4; S, 6.3.

EXAMPLE 11

Reaction of the alcoholic hydroxyl group in the backbone of the polysulfonate-carboxylate copolymer with hexanoyl chloride A one liter flask is charged with 50 g. (0.0247 mole) of a polysulfonate-carboxylate copolymer prepared with the same ingredients and essentially as described in Example 9 ($N_{inh}$=0.37) and 300 ml. of pyridine. To the resultant solution is added 14.6 g. (0.1087 mole) of hexanoyl chloride and 300 ml. of methylene chloride. The reaction solution is stirred at 60° C. for 5 hours and cooled overnight. The pyridine hydrochloride is filtered off and the polymer is precipitated in aqueous methanol. The polymer, copoly[3-hydroxy-1,5-pentylenebis(3-methoxy-p-phenylene)-co-3-hexanoyloxy - 1,5 - pentylenebis(3-methoxy-p-phenylene) 1,3 - dimethyl-2,4-benzenedisulfonate-co-isophthalate-co-terephthalate] is collected, dissolved in methylene chloride, and reprecipitated in methanol. Yield is 54 g. Inherent viscosity is 0.37.

*Analysis.*—Calcd. (percent): C, 64.56; H, 6.33; S, 5.30. Found (percent): C, 64.0; H, 6.2; S, 6.1.

EXAMPLES 12–31

Using the procedure of Examples 6 and 7, polysulfonates and polysulfonate-carboxylates are prepared using the monomers described below.

Code

α0=

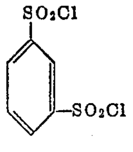

α1=

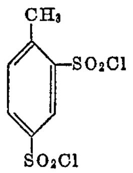

α2=

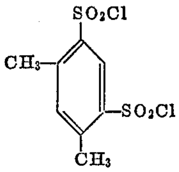

HDVA=1,5-bis(4-hydroxy-3-methoxyphenyl)pentan-3-one

HDVCP=2,5-bis(4-hydroxy-3-methoxybenzyl)cyclopentanone

BPA=Bisphenol A

TPC=Terephthaloyl chloride

IPC=Isophthaloyl chloride

Polysulfonate homopolymers having the structure:

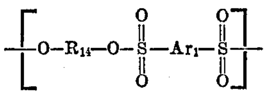

| Example | Monomers employed to derive— $R_{14}$ | $Ar_1$ | $\eta_{inh}$ |
|---|---|---|---|
| 12 | HDVA | α0 | 1.5 |
| 13 | HDVA | α1 | 1.2 |
| 14 | HDVA | α2 | 0.8 |
| 15 | HDVCP | α1 | 0.63 |

Polysulfonate copolymers having the structure:

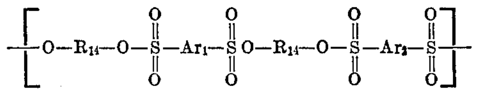

| Example | Monomers employed to derive— $R_{14}$ | $Ar_1$ | $Ar_2$ | $\eta_{inh}$ |
|---|---|---|---|---|
| 16 | HDVA | α0 | α1 | 0.8 |
| 17 | HDVA | α0 | α2 | 1.7 |
| 18 | HDVA | α1 | α2 | 1.2 |
| 19 | HDVCP | α0 | α1 | 1.2 |

Polysulfonate copolymers having the structure:

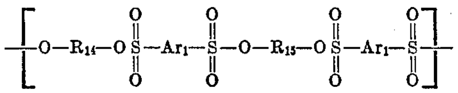

| Example | Monomers employed to derive— $R_{14}$ | $Ar_1$ | $R_{15}$ | $\eta_{inh}$ |
|---|---|---|---|---|
| 20 | BPA | α0 | HDVA | 1.3 |
| 21 | BPA | α1 | HDVA | 1.4 |
| 22 | BPA | α2 | HDVA | 0.6 |
| 23 | BPA | α1 | HDVCP | 0.40 |

Poly(sulfonate-carboxylates) having the structure:

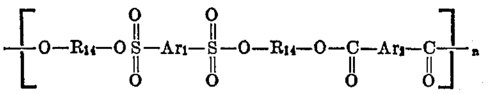

| Example | Monomers employed to derive— $R_{14}$ | $Ar_1$ | $Ar_2$ | $\eta_{inh}$ |
|---|---|---|---|---|
| 24 | HDVA | α0 | TPC | 1.4 |
| 25 | HDVA | α1 | TPC | 1.8 |
| 26 | HDVA | α2 | TPC | 1.3 |
| 27 | HDVCP | α1 | TPC | 0.82 |

Poly(sulfonate-carboxylates) having the structure:

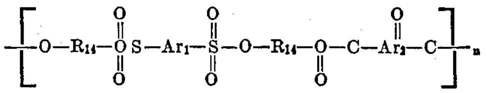

| Example | Monomers employed to derive— $R_{14}$ | $Ar_1$ | $Ar_2$ | $\eta_{inh}$ |
|---|---|---|---|---|
| 28 | HDVA | α0 | TPC/IPC | 0.61 |
| 29 | HDVA | α1 | TPC/IPC | 0.78 |
| 30 | HDVA | α2 | TPC/IPC | 0.44 |
| 31 | HDVCP | α1 | TPC/IPC | 0.58 |

EXAMPLES 32–35

Using the procedure of Example 11 and polymers prepared in accordance with Examples 8–10, the alcoholic hydroxyl group on the polymer is reacted with various carboxylic acid chlorides to yield polymers having the structure:

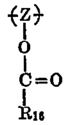

| Example | $R_{16}$ | $\eta_{inh}$ |
|---|---|---|
| 32 | $CH_3(CH_2)_4$— | 0.81 |
| 33 | $CH_3(CH_2)_6$— | 1.61 |
| 34 | $CH_3(CH_2)_3CH(C_2H_5)$— | 0.77 |
| 35 | $CH_3(CH_2)_{16}$— | 0.43 |

EXAMPLE 36

Preparation of a photopolymerizable composition and element.

Formulations are prepared as follows: Preparation of Solution A (polymeric binder).—Five grams of the polysulfonate copolymer prepared in Example 6 is dissolved in 25 ml. of 1,2-dichloroethane.

Preparation of Solution B.—Ten milliliters of Solution A is diluted with 5 cc. of dichloroethane. To this solution is added 5 cc. of a 50% wt./vol. solution in 1,2-dichloroethane of the monomer of Example 1 and 0.18 g. of 2-methoxy-2-phenylacetophenone. The above composition, Solution B, is knife-coated at a wet coating thickness of 0.012 inch on an anodized aluminum support. The coating is dried at 24° C. for 15 minutes and at 43° C. for an additional 15 minutes. A transparent cover sheet (1 mil thick) is placed over the coating and the coating exposed imagewise to a pulsed xenon source for four minutes. The exposed plate is swab-developed with dichloroethane using a cotton pad for one minute. A good robust image is obtained. Similar results are obtained with photopolymerizable compositions containing the photopolymerizable sulfonate/carboxylates of Examples 2–5 and the polymers of Examples 12–31 which are prepared, coated, exposed and developed by the procedures described in this example.

EXAMPLE 37

The preparation of relief images without a polymeric binder

One gram of the monomer of Example 1 is dissolved in 3 cc. of 1,2-dichloroethane and 0.1 g. of 2-methoxy-2-phenylacetophenone is added. This composition is whirl-coated on anodized aluminum at 130 r.p.m. for 15 minutes. The coated plates are covered with a transparent cover sheet and then exposed imagewise to a pulsed xenon source for 4 minutes. The exposed plates are developed with a 50/50 mixture of 1,1,1-trichloroethane and 1,1,2-trichloroethane for 1 minute. Good images are obtained.

EXAMPLE 38

The preparation of a photopolymerizable composition and element

A formulation is prepared as follows:

100 cc. of a 20% (wt./vol.) solution of the polymer of Example 28 in dichloroethane
50 cc. of a 20% (wt./vol.) solution of the monomer of Example 1 in dichloroethane
50 cc. of dichloroethane
1.8 g. of 2-methoxy-2-phenylacetophenone.

The formulation is knife coated at a wet thickness of 0.012 inch on an anodized aluminum substrate. The coating is dried at room temperature for one hour. It is then exposed imagewise to a pulsed xenon exposure device for 4200 ft. candle minutes and developed by swabbing with dichloroethane or trichloroethylene solvents. The processed plate is then etched in 25% aqueous sodium hydroxide for 13 minutes. There is essentially no breakdown in the resist coating.

The invention has been described in detail with reference to preferred embodiments thereof, but it will be understood that variations and modifications can be effected within the spirit and scope of the invention.

What is claimed is:

1. A photopolymerizable composition comprising:
(a) an ethylenically unsaturated sulfonate-carboxylate monomer,
(b) a film-forming aromatic polysulfonate or polysulfonate-carboxylate binder and
(c) a photoactivatable polymerization initiator.

2. A composition of claim 1 wherein the monomer has the formula

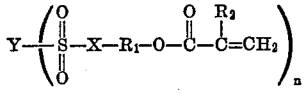

where Y is a di-, tri-, or tetravalent aromatic group or a di- or trivalent aliphatic group, $R_1$ is an alkylene group, an arylene group, or a mixed alkylene-arylene group, $R_2$ is hydrogen or methyl, X is oxygen or an imino group and *n* is an integer of 2 to 4.

3. A composition of claim 2 wherein the monomer has the structure

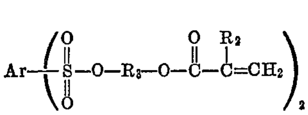

wherein Ar is an arylene group, $R_2$ is hydrogen or a methyl group and $R_3$ is an alkylene group of 2 to 4 carbon atoms.

4. A composition of claim 3 wherein Ar is phenylene.

5. A composition of claim 1 wherein the film-forming binder is the condensation product of at least one bisphenol, in at least one of which the phenol groups are joined by an aliphatic ketone group or an aliphatic secondary alcohol group, with at least one aromatic disulfonic acid chloride or with a mixture of at least one aromatic disulfonic acid chloride and at least one aromatic dicarboxylic acid chloride or aromatic bischloroformate.

6. A composition of claim 5 wherein the phenol groups of at least one of the bisphenols are joined by an aliphatic secondary alcohol group.

7. A composition of claim 6 wherein the film-forming binder is the condensation product of claim 6 further modified by reaction with an alkyl acid chloride to convert aliphatic secondary alcohol groups to aliphatic ester groups.

8. A composition of claim 2 wherein the film-forming binder has repeating units derived from at least one bisphenol, at least one of which provides repeating units having the structure.

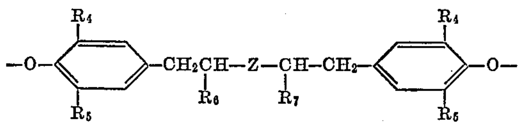

where $R_4$ and $R_5$ are each hydrogen, lower alkyl of 1 to 4 carbon atoms or lower alkoxy of 1 to 4 carbon atoms; $R_6$ and $R_7$ are each hydrogen or together represent the hydrocarbon group necessary to complete a saturated ring of 5 to 6 carbon atoms; Z is a

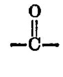

group or a

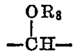

group; and $R_8$ is hydrogen or an alkanoyl group of 2 to 20 carbon atoms; alternating with repeating units derived from at least one aromatic diacid chloride, at least one of which provides repeating units having the structure

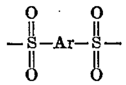

wherein Ar represents an arylene group.

9. A composition of claim 8 wherein the binder further comprises repeating units derived from a second bisphenol, which units have the structure

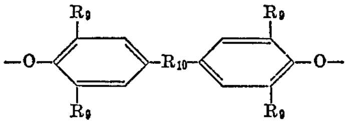

wherein $R_9$ is independently hydrogen, halogen or lower alkyl of 1 to 4 carbon atoms and $R_{10}$ is an alkylene group of 1 to 8 carbon atoms, and alternating units derived from an aromatic diacid chloride, which units have the structure

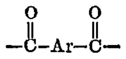

wherein Ar is an arylene group.

10. A composition of claim 8 wherein the binder further comprises repeating units derived from a second bisphenol, which units have the structure

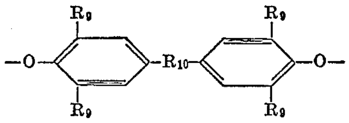

wherein $R_9$ is independently hydrogen, halogen or lower alkyl of 1 to 4 carbon atoms and $R_{10}$ is an alkylene group of 1 to 8 carbon atoms, and alternating units derived from an aromatic diacid chloride, which units have the structure

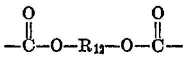

where $R_{12}$ is an alkylene group of 1 to 20 carbon atoms.

11. A composition of claim 2 wherein the film-forming binder has repeating units derived from at least one bisphenol, at least one of which provides repeating units having the structure

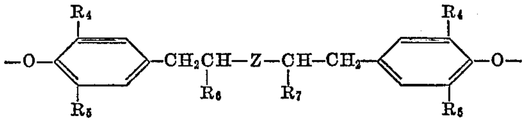

where $R_4$ and $R_5$ are each hydrogen, lower alkyl of 1 to 4 carbon atoms or lower alkoxy of 1 to 4 carbon atoms; $R_6$ and $R_7$ are each hydrogen or together represent the hydrocarbon group necessary to complete a saturated ring of 5 to 6 carbon atoms; Z is a

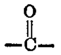

group or a

group; and $R_8$ is hydrogen or an alkanoyl group of 2 to 20 carbon atoms; alternating with repeating units derived from at least one aromatic diacid chloride, at least one of which provides repeating units having the structure

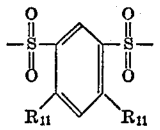

wherein $R_{11}$ is independently a hydrogen atom or a lower alkyl group of 1 to 4 carbon atoms.

12. A composition of claim 11 wherein the binder further comprises repeating units derived from a second bisphenol, which units have the structure

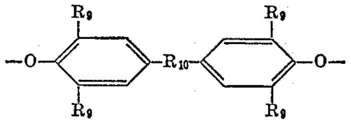

wherein $R_9$ is independently hydrogen, halogen or lower alkyl of 1 to 4 carbon atoms and $R_{10}$ is an alkylene group of 1 to 8 carbon atoms, and alternating units derived from an aromatic diacid chloride, which units have the structure

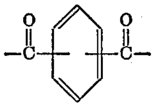

13. A composition of claim 11 wherein the binder further comprises repeating units derived from a second bisphenol, which units have the structure

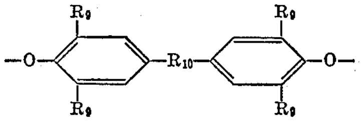

wherein $R_9$ is independently hydrogen, halogen or lower alkyl of 1 to 4 carbon atoms and $R_{10}$ is an alkylene group of 1 to 8 carbon atoms, and alternating units derived from an aromatic diacid chloride, which units have the structure

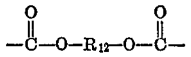

where $R_{12}$ is an alkylene group of 1 to 20 carbon atoms.

14. A photopolymerizable composition comprising:

(a) an ethylenically unsaturated sulfonate-carboxylate monomer having the structure

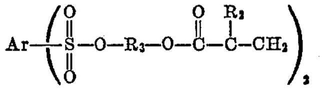

where Ar is a phenylene group, $R_2$ is hydrogen or a methyl group and $R_3$ is an alkylene group of 2 to 4 carbon atoms;

(b) a film-forming binder having repeating units having the structure

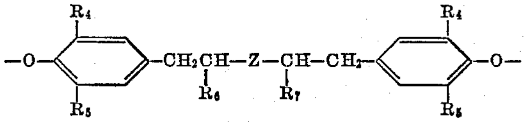

where $R_4$ and $R_5$ are each hydrogen, lower alkyl of 1 to 4 carbon atoms or lower alkoxy of 1 to 4 carbon atoms; $R_6$ and $R_7$ are each hydrogen or together represent the hydrocarbon group necessary to complete a saturated ring of 5 to 6 carbon atoms; Z is a

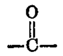

group or a

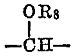

group; and $R_8$ is hydrogen or an alkanoyl group of 2 to 20 carbon atoms; alternating with repeating units derived from at least one aromatic diacid chloride, at least one of which provides repeating units having the structure

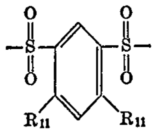

wherein $R_{11}$ is independently a hydrogen atom or a lower alkyl group of 1 to 4 carbon atoms; and (c) a photoactivatable polymerization initiator.

15. A photosensitive element comprising a support bearing a layer of the composition of claim 1.

16. A photosensitive element comprising a support bearing a layer of the composition of claim 3.

17. A photosensitive element comprising a support bearing a layer of the composition of claim 7.

18. A photosensitive element comprising a support bearing a layer of the composition of claim 8.

19. A photosensitive element comprising a support bearing a layer of the composition of claim 11.

20. A photosensitive element comprising a support bearing a layer of the composition of claim 14.

21. A process for preparing a photomechanical image which comprises exposing to an imagewise pattern of actinic radiation an element of claim 15 to harden exposed areas of the composition and developing an image by removing unexposed composition from the element.

References Cited

UNITED STATES PATENTS

| | | | |
|---|---|---|---|
| 3,262,914 | 7/1966 | Goldberg | 260—546 P |
| 3,615,448 | 10/1971 | Yeshin | 96—115 P |
| 3,627,529 | 12/1971 | Frank | 96—115 P |
| 3,401,148 | 9/1968 | Schlott | 260—49 |

NORMAN G. TORCHIN, Primary Examiner

J. L. GOODROW, Assistant Examiner

U.S. Cl. X.R.

260—456 P; 96—115 P